(12) United States Patent
Goldstein et al.

(10) Patent No.: US 7,002,164 B2
(45) Date of Patent: Feb. 21, 2006

(54) SOURCE MULTIPLEXING IN LITHOGRAPHY

(75) Inventors: Michael Goldstein, Ridgefield, CT (US); Peter J. Silverman, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 10/339,789

(22) Filed: Jan. 8, 2003

(65) Prior Publication Data

US 2004/0129895 A1 Jul. 8, 2004

(51) Int. Cl.
*G21G 5/00* (2006.01)
*G21G 4/00* (2006.01)

(52) U.S. Cl. .............................. 250/492.2; 250/492.1; 250/493.1; 250/494.1; 353/37; 353/99

(58) Field of Classification Search ............ 250/492.2, 250/492.21, 492.1, 493.1, 494.1; 353/37, 353/99; 355/66, 67
See application file for complete search history.

(56) References Cited

U.S. PATENT DOCUMENTS

| | | | | |
|---|---|---|---|---|
| 6,399,935 B1 * | 6/2002 | Jovin et al. | ................ | 250/216 |
| 6,426,506 B1 * | 7/2002 | Hudyma | ................ | 250/492.2 |
| 6,479,830 B1 * | 11/2002 | Fornaca et al. | ........ | 250/492.21 |
| 6,570,168 B1 * | 5/2003 | Schultz et al. | ........... | 250/492.2 |

* cited by examiner

*Primary Examiner*—John R. Lee
*Assistant Examiner*—Paul M. Gurzo
(74) *Attorney, Agent, or Firm*—Fish & Richardson P.C.

(57) ABSTRACT

An illumination system for an extreme ultraviolet (EUV) lithography system may include multiple sources of EUV light. The system may combine the light from the multiple sources when illuminating a mask.

6 Claims, 7 Drawing Sheets

SOURCE MULTIPLEXING IN LITHOGRAPHY

BACKGROUND

The progressive reduction in feature size in integrated circuits (ICs) is driven in part by advances in lithography. ICs may be created by alternately etching material away from a chip and depositing material on the chip. Each layer of materials etched from the chip may be defined by a lithographic process in which light shines through or reflected from a mask, exposing a photosensitive material, e.g., a photoresist after imaging through projection optics.

The ability to focus the light used in lithography, and hence to produce increasingly smaller line widths in ICs, is a function of the wavelength of the light used. Current techniques may use light having a wavelength of about 193 nm. The use of "soft" x-rays (wavelength range of $\lambda \approx 10$ nm to 20 nm) in lithography is being explored to achieve smaller desired feature sizes. Soft x-ray radiation may also be referred to as extreme ultraviolet (EUV) radiation.

DETAILED DESCRIPTION

Figure 1:
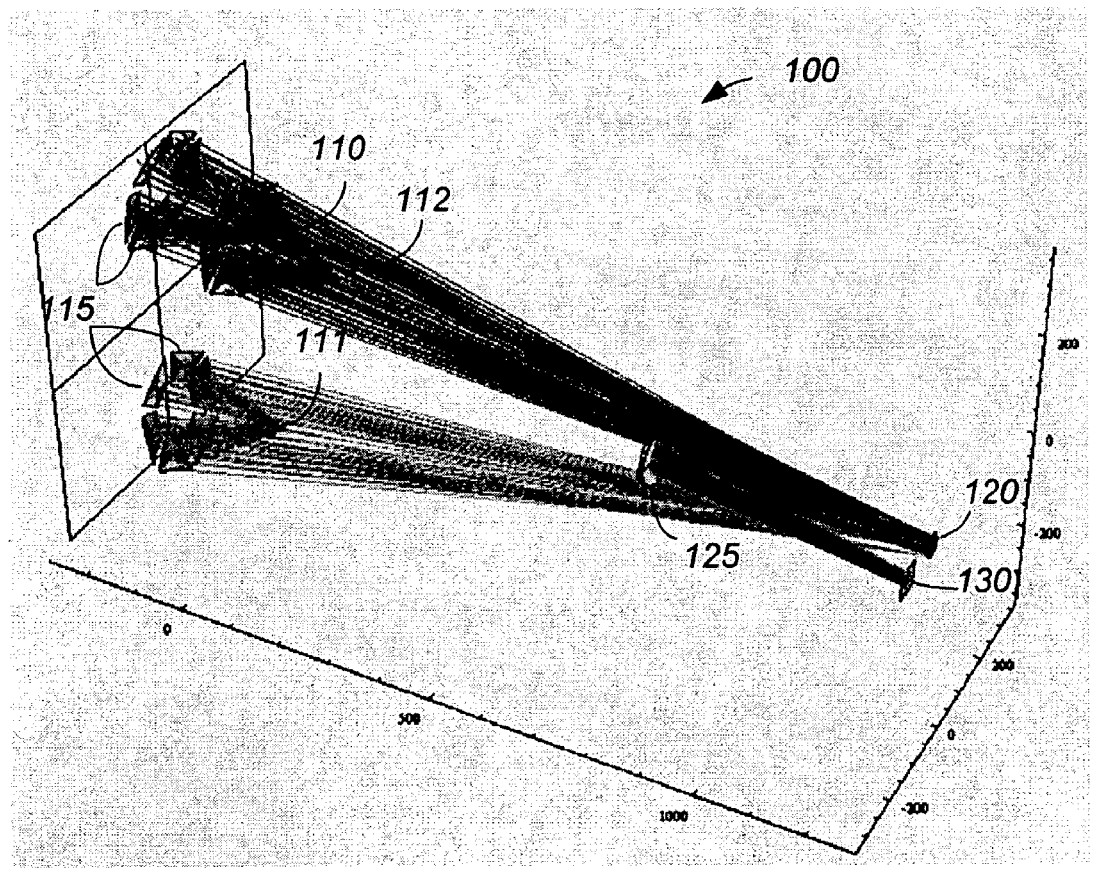
FIG. 1 is a perspective view of an illumination system for an Extreme Ultraviolet (EUV) lithography system.

FIG. 1 illustrates an illumination system 100 for a lithography system. In an embodiment, the lithography system may be an Extreme Ultraviolet (EUV) lithography system. EUV lithography is a projection lithography technique which may use a reduction optical system and illumination in the soft X-ray spectrum (wavelengths in the range of about 10 nm to 20 nm).

The system 100 may include multiple sources of EUV radiation 110–112, imaging collectors 115, a multi-element pupil 120, and condenser optics 125. The optical elements in the system (e.g., the imaging collectors 115, pupil 120, and condenser 125) may be mirrors made to be reflective to EUV light of a particular wavelength (typically 13.4 nm) by means of multilayer coatings (typically of Mo and Si). Since EUV is strongly absorbed by materials and gases, the lithography process may be carried out in a vacuum, and a reflective, rather than transmissive, reticle mask 130 may be used.

In an embodiment, the sources 110–112 of soft X-rays may be a compact high-average-power, high-repetition-rate laser which impact a target material to produce broad band radiation with significant EUV emission. The target material may be, for example, a noble gas, such as Xenon (Xe), condensed into liquid or solid form. The target material may convert a portion of the laser energy into a continuum of radiation peaked in the EUV. Other approaches may also be taken to produce the EUV plasma, such as driving an electrical discharge through the noble gas.

The system 100 may combine the illumination from the multiple sources 110–112 such that the light from the sources overlap at the same image plane, e.g., the mask plane 130. This may increase the available power of the system above that available with a single source. For example, the sources in a multi-source EUV lithography system may generate about 35 watts individually, but may provide a power output of 70 watts or more when combined.

Figure 2:
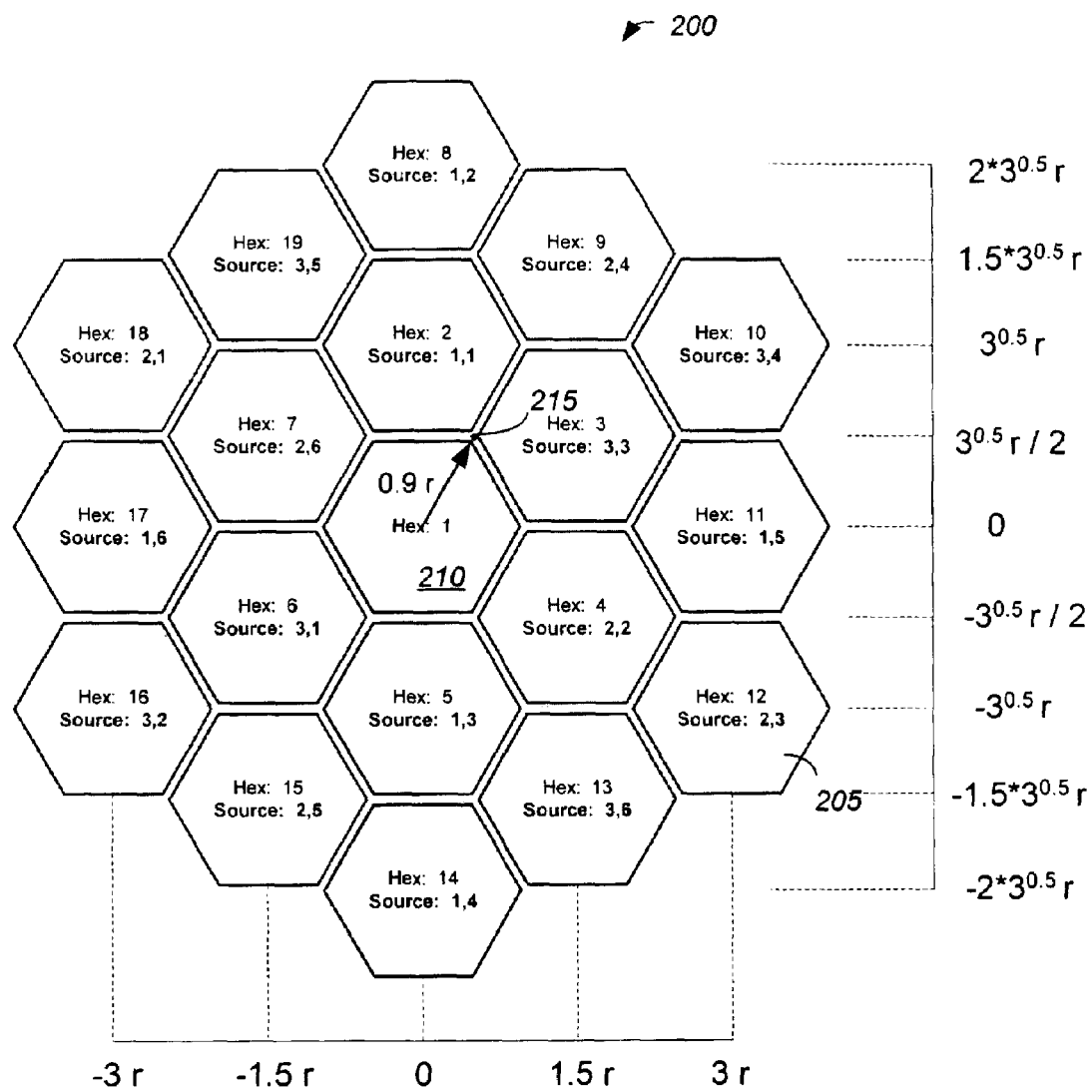
FIG. 2 is a plan view of an array of hexagonal mirrors in a multi-element pupil.

The multi-element pupil 120 may include an array of hexagonal mirrors. FIG. 2 shows a coordinate system for the hexagonal mirrors in an array 200. Elliptical mirror sections may be used as imaging collectors 115. Each source may have six associated elliptical mirror sections. One foci of each elliptical mirror section may be at one of the sources 110–112, and the second foci of each elliptical mirror section may be at the center of one of the hexagonal mirrors in the pupil array 120.

The designation "Source: x, y" in FIG. 2 identifies the source (x) the hexagonal mirror is imaging and the number of the elliptical mirror section (y) associated with source (x) that the hexagonal mirror is imaging light from. For example, the hexagonal mirror 205 with the designation "Source: 2, 3" images light from elliptical mirror section number 3 focusing light from source 2. The central hexagonal mirror 210 may receive no light. The distance "r" on the axes refers to the distance from the center of hexagonal mirror 210 to the position 215 at the center between the vertices of three adjoining hexagonal mirrors. The center to vertices distance for a hexagonal mirror may be about 0.9 r.

Figure 3:
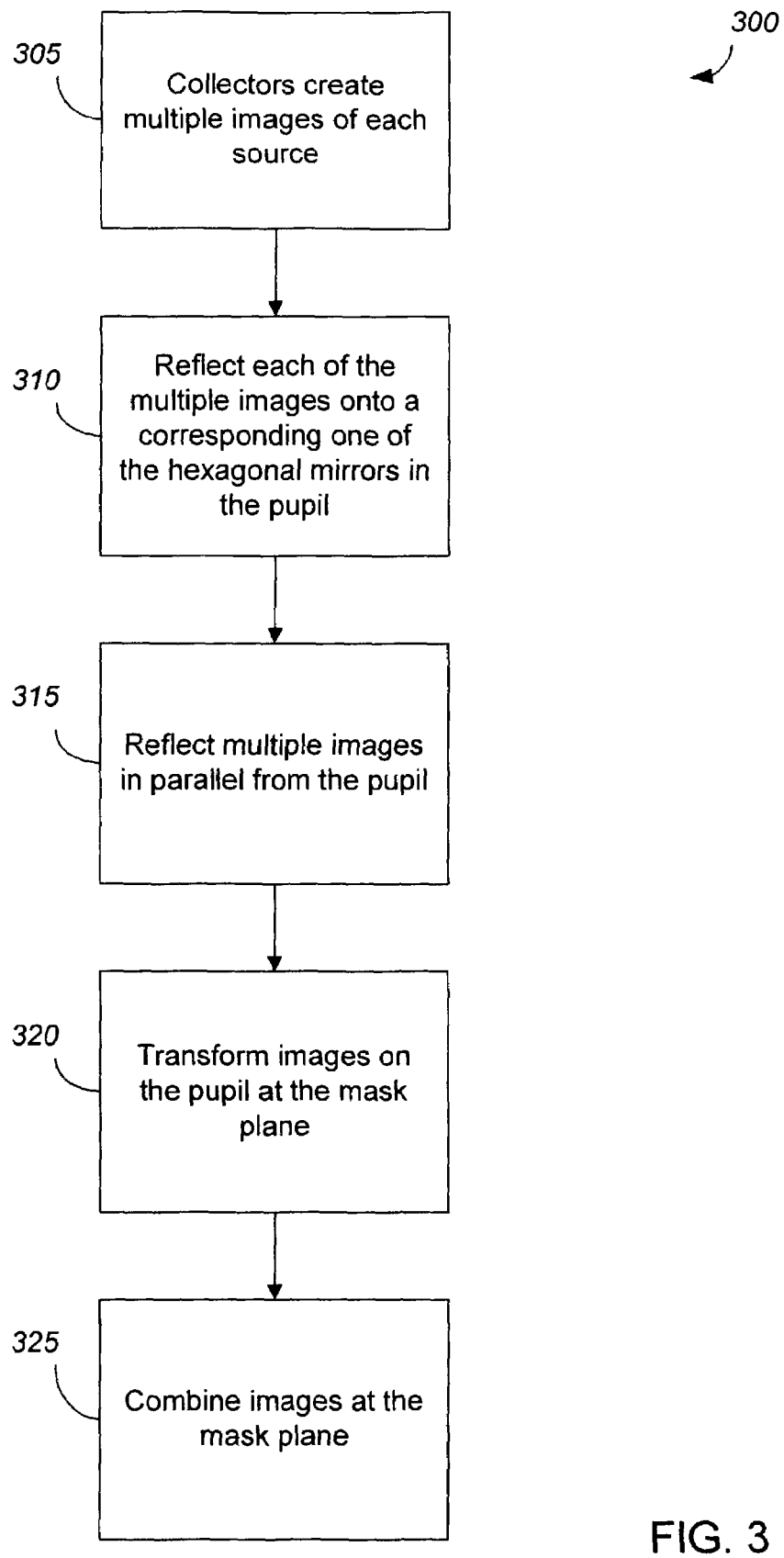
FIG. 3 is a flowchart describing a method for imaging a mask pattern on a wafer using multiple sources of illumination.

FIG. 3 is a flowchart describing a method 300 for imaging a mask image onto a wafer using multiple sources of radiation. The elliptical mirror sections may create eighteen source images, e.g., six images of each of the three sources 110–112 (block 305). Each of the eighteen source images may be reflected onto one of the hexagonal mirrors in the array 200, providing eighteen source images at the pupil 120 (block 310). The position and tilt of the hexagonal mirrors in array 200 may be selected such that the central rays of the source images hitting the hexagonal mirrors are reflected parallel to one another (block 315).

The condenser optics 125 may produce a transformation of the images at the pupil at the mask plane (block 320). The effect of the transformation may be that light from all positions on the hexagonal mirror array 200 with the same angle arrive at the same position at the mask plane but at interleaved angles. In addition, light leaving the array 200 from different angles may arrive at the mask plane 130 at different positions. In this manner, the central rays of the source images leaving in parallel from the array 200 may focus to a point at the center of the mask plane at interleaved angles. The images may overlap and the illumination from the multiple sources 110–112 may combine at the mask plane (block 325).

The radiation from the condenser 125 may be directed onto the mask 130. The mask may include reflecting and absorbing regions. The reflected EUV radiation from the mask 130 may carry an IC pattern on the mask to a photoresist layer on a wafer. The entire reticle may be exposed onto the wafer by synchronously scanning the mask and the wafer, e.g., by a step-and-scan exposure operation. Light from the mask is imaged on to the wafer using projection optics.

The arrangement of the hexagonal mirrors in the array shown in FIG. 2 may cause the reflected source images to interleave in angle in a way that prevents variations in the power or intensity from any one source from substantially changing the net weighted position of the illumination at the pupil.

A consideration in designing optical systems is etendue. Etendue is a conserved, invariant quantity in an optical system that may be expressed as $$NA^2 \times A = \text{constant}$$

where NA is the numerical aperture of the radiation incident at a surface of area A. Etendue may represent a measure of the maximum beam size and solid angle that can be accepted by an optical system.

The system may be designed such that the combined etendue of the sources 110–112 may be less than or equal to the etendue accepted by the production optics. If the etendue is consumed by one of the sources, another source image may not be able to be interleaved at the image plane.

Figure 4:
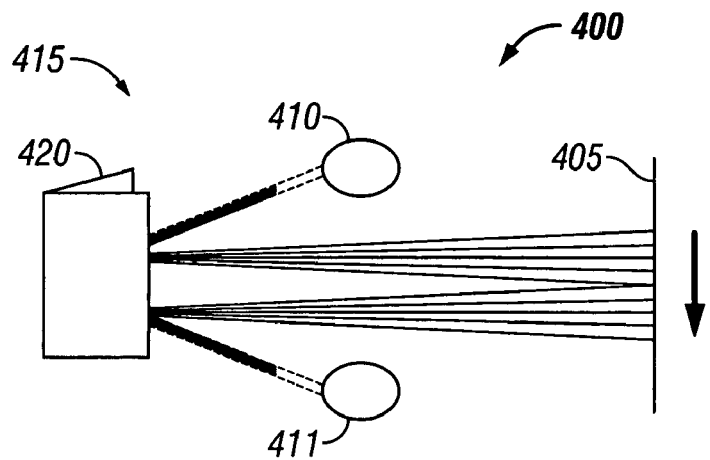
FIG. 4 is a light combining section of an illumination system.

In an alternative illumination system 400, a reflective mask 405, or reticle, may be illuminated by light from multiple sources 410–411 of EUV radiation, as shown in FIG. 4. The surface of the reticle 405 may contain the pattern to be imaged on the wafer. In an embodiment, an illuminator 415 may use an optical element, such as a corner mirror 420, to combine the light from the EUV sources 410–411.

The lithography system in which the illumination system 400 is utilized may be a scanning system. In a scanning system, the reticle and the wafer may be scanned simultaneously under the illumination. The reticle and the wafer may be mounted on sliding assemblies. The reticle may be illuminated with a rectangular beam of light which scans across the patterned area as the reticle is moved in a scanning direction. In an embodiment, a reduction ratio demagnification in the scanning system may be 4×. In such a system, the reticle may travel at a speed four times faster than that of the wafer in order to have the image overlap properly.

Figure 5:
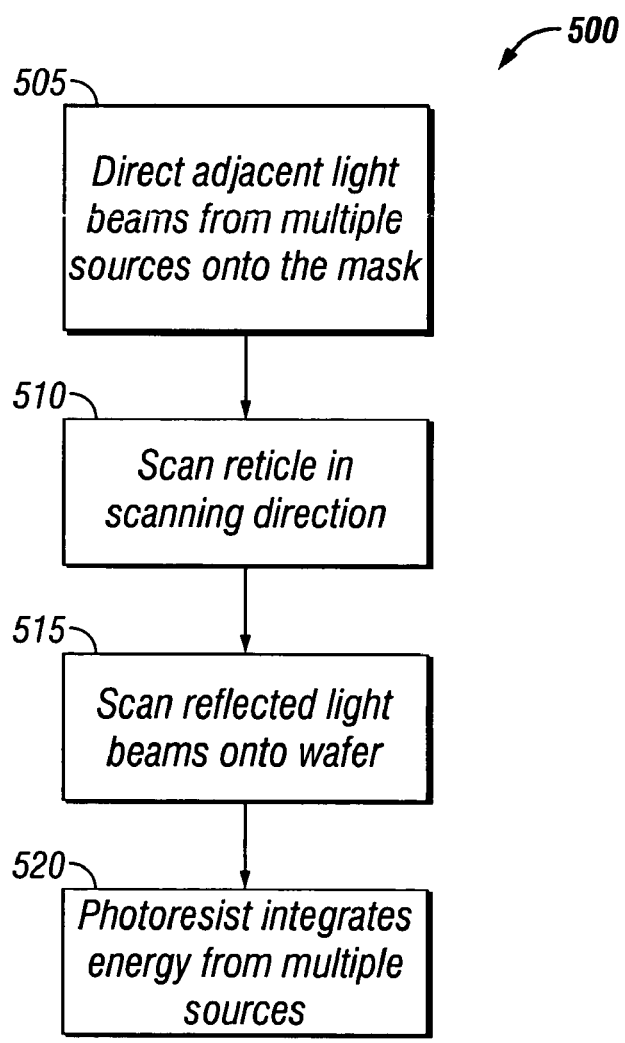
FIG. 5 is a flowchart describing an alternative method for imaging a mask pattern on a wafer using multiple sources of illumination.
Figure 6:
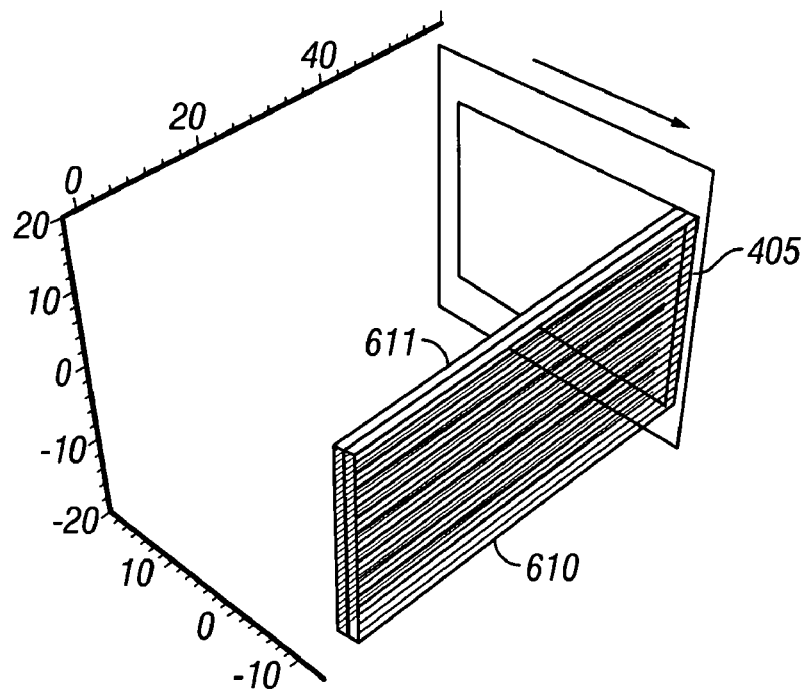
FIG. 6 is a perspective view of a scanning reticle receiving light beams from multiple sources of illumination. The quality of the diagrams has dropped and needs to be fixed.

FIG. 5 is a flowchart describing a method 500 for illuminating a scanning reticle using multiple sources of radiation. As shown in FIG. 6, light beams 610 and 611 from the sources 410 and 411, respectively, may be directed onto the reticle 405 substantially adjacent to one another in the scanning direction 620 (block 505). The reticle 405 may be scanned under the illumination (block 510) so that each part of the pattern receives the same amount of integrated energy from the two beams. The illumination may be begun before the beginning of the pattern and stopped after the end of the pattern. The light beams may be reflected from the reticle 405 onto the image plane such that the pattern image is scanned on the wafer as the reticle is scanned (block 515). A photoresist layer on the wafer may integrate the energy from both sources (block 520).

The total etendue of the system may set the limit on the number of sources which may be employed in the system.

As described above, EUV light may be strongly absorbed by many materials, including optical elements in the system. In an embodiment, the amount of light reflected from reflective surfaces in an EUV lithography system may be about 67%. The inclusion of the corner mirror 420 in the system may increase losses in EUV energy in the optical path due to absorption by the added mirror 420.

Figure 7:
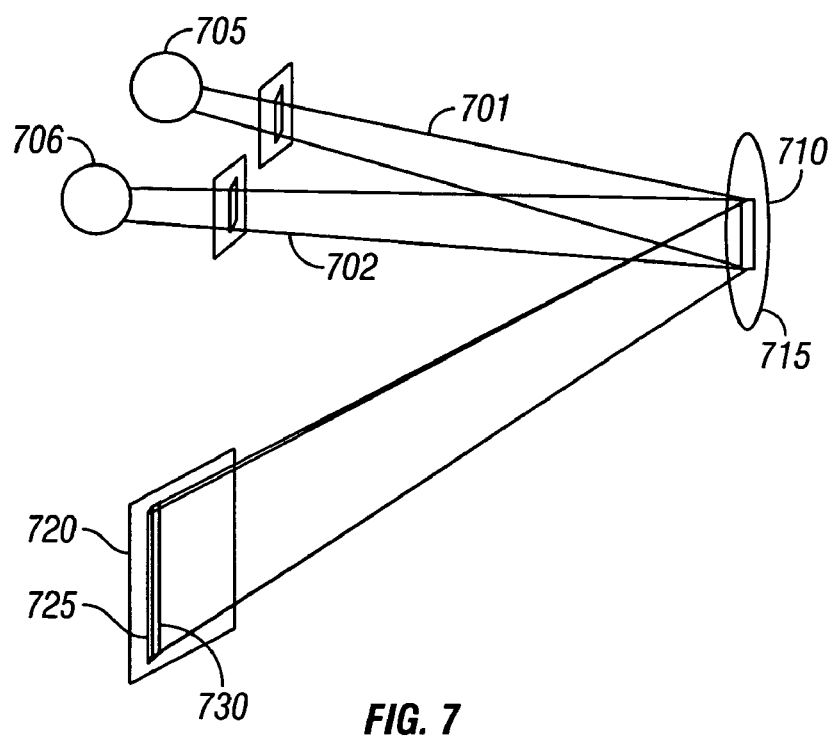
FIG. 7 is a light combining section of an alternative illumination system.

In an alternative embodiment, the use of an additional optical element, e.g., the corner mirror 420, in the optical path may be avoided. Light beams 701–702 from multiple sources 705–706, respectively, may be directed to a pupil 710 at different angles so that they overlap at a position 720 on the transform plane at the pupil, as shown in FIG. 7. As described above, a position at the pupil 710 may correspond to an angle at the image plane at the mask and an angle at the pupil may be transformed to a position at the image plane 715. The angles may be selected such that the light beams arrive at the image plane in positions 725 and 730, which are parallel and adjacent to each other.

Figure 8:
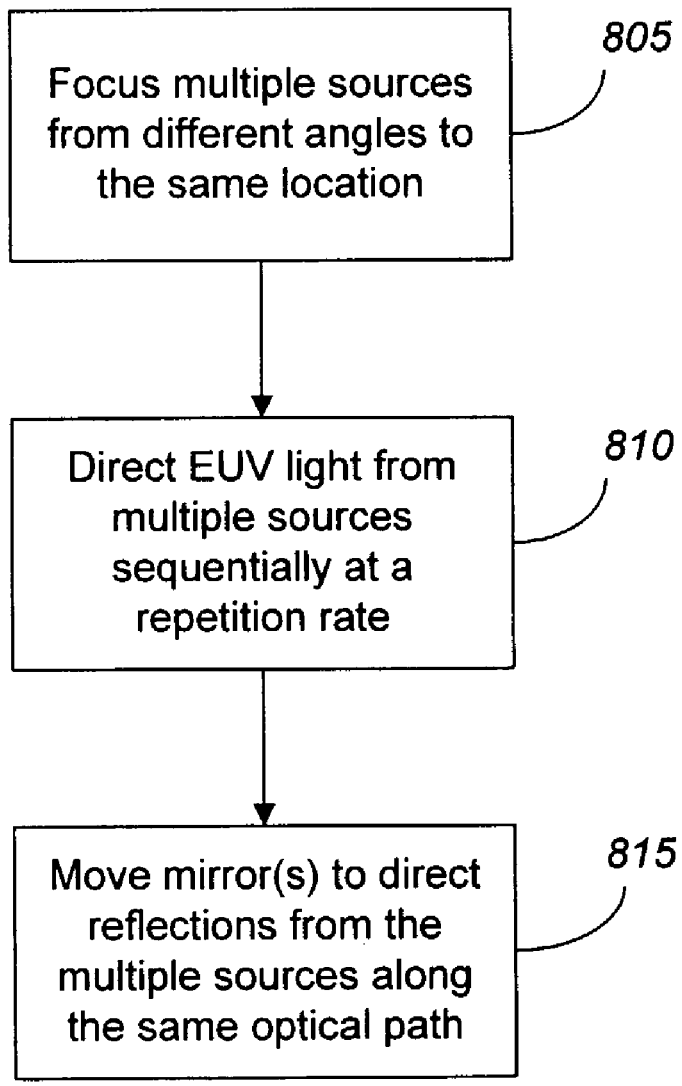
FIG. 8 is a flowchart describing a method for multiplexing light from multiple sources.
Figure 9:
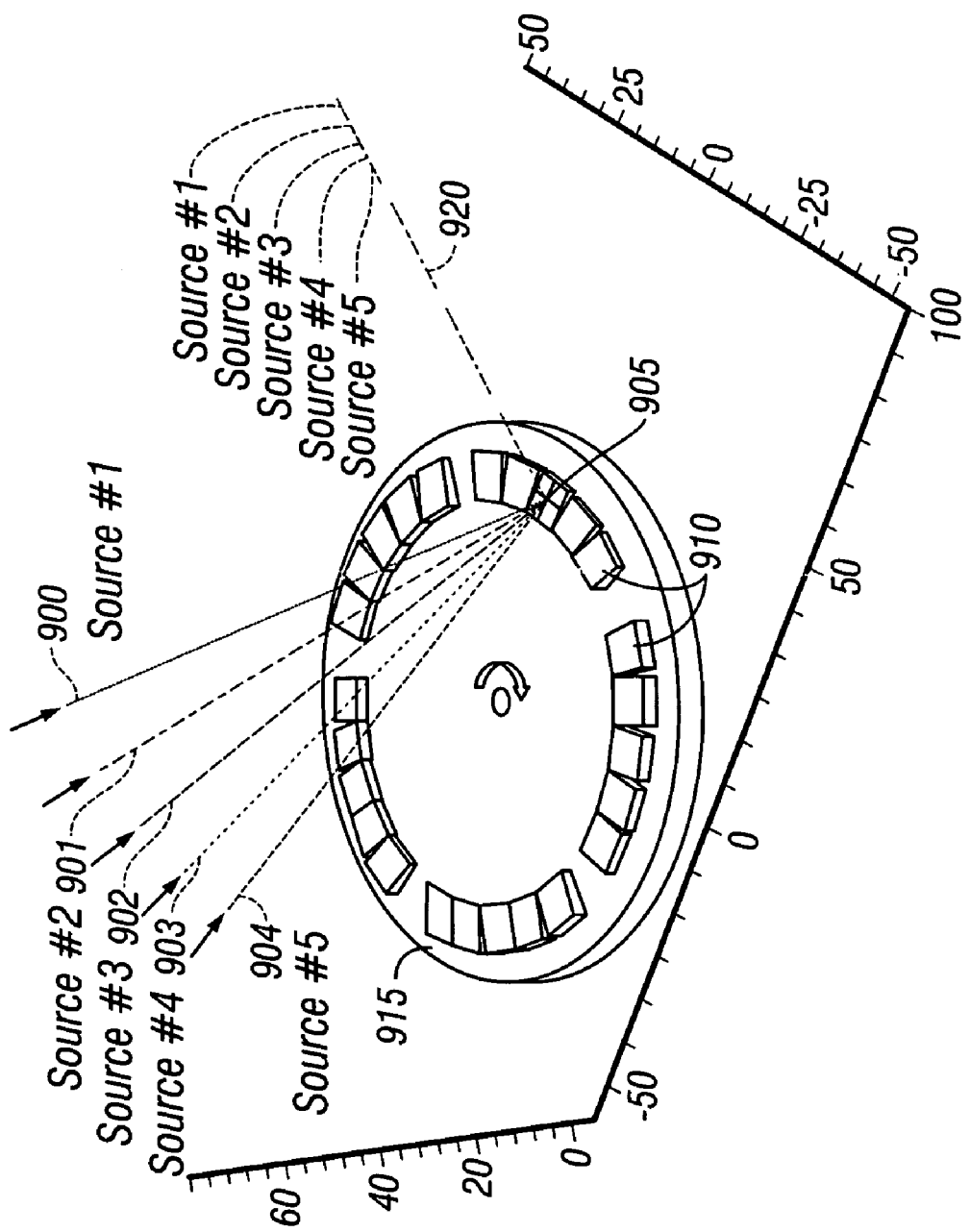
FIG. 9 is a perspective view of a light combining section of an illumination system utilizing rotating mirrors.

In another embodiment, light from multiple sources may be multiplexed in time. FIG. 8 is a flowchart describing a method 800 for multiplexing light from multiple sources. As shown in FIG. 9, two or more EUV light sources 900–904 may be focused at the same focal point 905, but at different angles (block 805). The light from the multiple sources may be directed to the focal point 910 sequentially at a relatively high repetition rate, e.g., several kilohertz (block 810). A set of mirrors 910 on a rotating base 915 may be positioned under the point of focus 905 synchronously with the repetition rate of the sources to align all of the reflections to the same optical path 920 (block 815). The mirrors 910 may be angled to direct the light from different sources arriving at different angles along the optical path 920. A number of different sets of mirrors may be rotated on the base to reduce the rate at which the base must rotate. For example, in the system shown in FIG. 9, five separate sets of five mirrors are rotated under the five sources 900–904. Alternatively, a single moving mirror may be used, but may need to be tilted and tipped at a precise angle and at a precise time to correctly align the reflections from the different sources.

A number of embodiments have been described. Nevertheless, it will be understood that various modifications may be made without departing from the spirit and scope of the invention. For example, blocks in the flowcharts may be skipped or performed out of order and still produce desirable results. Also, the illumination system may be used in other lithography systems, e.g., an x-ray lithography system. Accordingly, other embodiments are within the scope of the following claims.

What is claimed is:

1. A method comprising:
   scanning substantially parallel beams of light across a patterned portion of a mask during a lithographic imaging operation, wherein the beams are distinct and each beam is generated by a different one of a plurality of sources, and wherein the substantially parallel beams of light illuminate different portions of the mask while being scanned across the mask.

2. The method of claim 1, further comprising:
   forming a first beam of light on a mask, said first beam of light originating from a first one of a plurality of sources; and
   forming a second beam of light on the mask, said second beam of light originating from a second one of said plurality of sources and being positioned substantially parallel to the first beam of light, and
   wherein said scanning comprises moving the mask relative to said beams of light in a scanning direction so that the mask is illuminated to the second beam of light subsequent to the first beam of light.

3. The method of claim 2, wherein forming said first beam of light comprises forming a beam having a length at least as long as a length of a mask pattern on the mask and a width less than a width of the mask pattern, and wherein forming said second beam of light comprises forming a beam having a length at least as long as the length of the mask pattern and a width less than the width of the mask pattern.

4. The method of claim 3, wherein the length of the first beam and the length of the second beam are substantially perpendicular to the scanning direction.

5. The method of claim 1, wherein the substantially parallel lights are only partially coherent.

6. The method of claim 1, wherein the substantially parallel beams of light comprise extreme ultraviolet (EUV) radiation.

* * * * *